April 17, 1973 J. L. DAVIDSON ET AL 3,728,179

METHOD OF ETCHING SILICON CRYSTALS

Filed May 20, 1970 2 Sheets-Sheet 1

INVENTORS
JIMMY L. DAVIDSON &
DONALD R. MASON

By Hurwitz & Rose
ATTORNEYS

FIG. 4 { ETCH RATE of SILICON AS A FUNTION of the WATER CONTENT OF THE ETCH WITH PYROCATECHOL CONTENT HELD CONSTANT
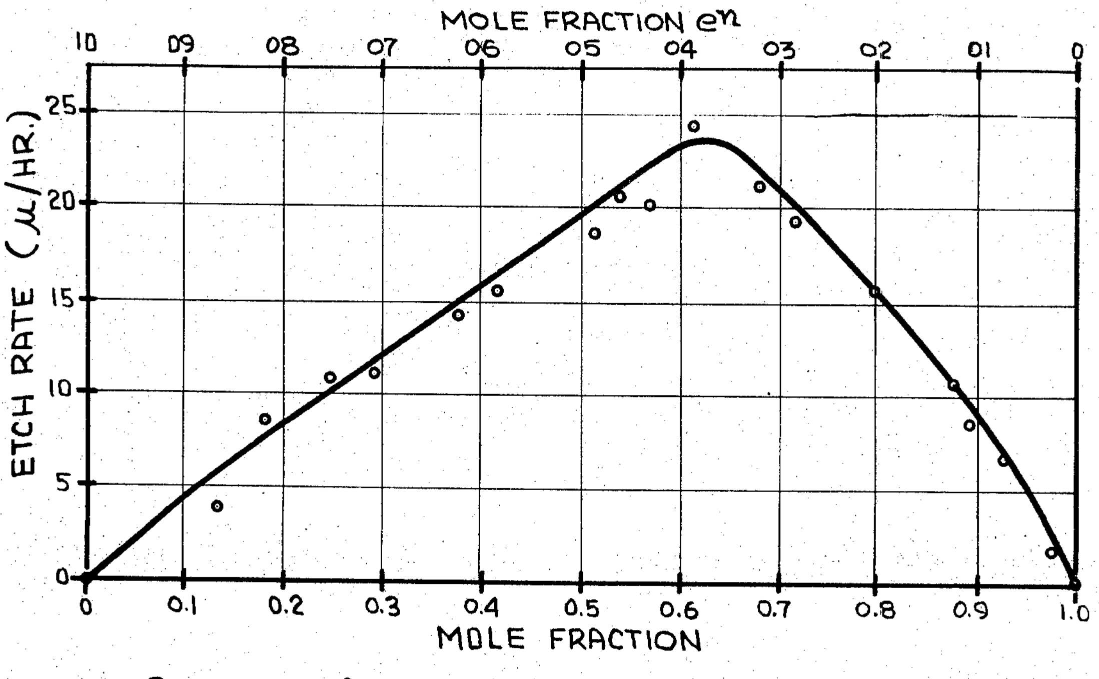
FIG. 5 { ETCH RATE of SILICON as a FUNCTION of the PYROCATECHOL CONTENT of a CONSTANT COMPOSITION EN-WATER MIXTURE
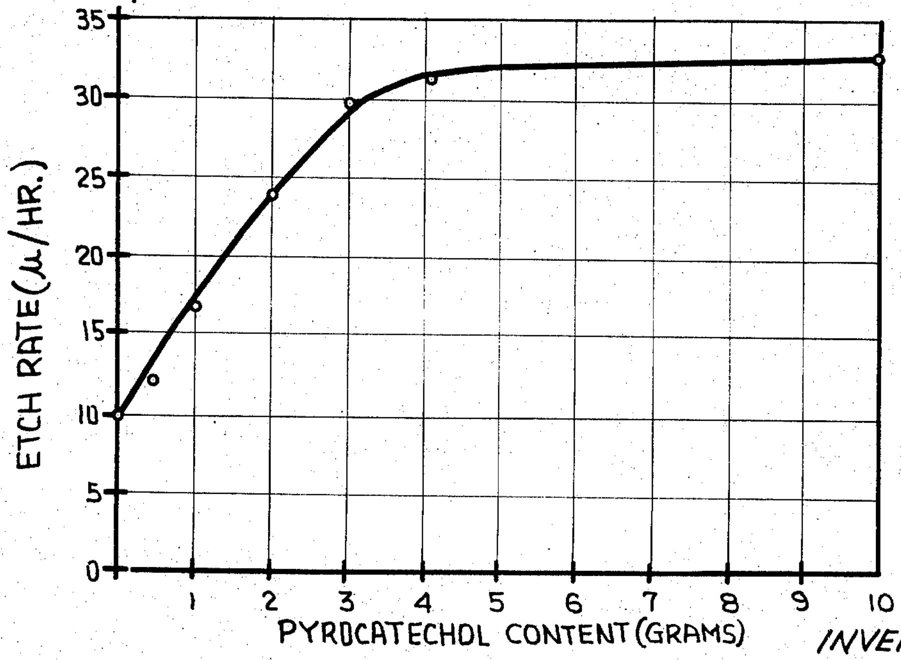
INVENTORS
JIMMY L. DAVIDSON &
DONALD R. MASON
By Hurwitz & Rose
ATTORNEYS United States Patent Office 3,728,179
Patented Apr. 17, 1973

3,728,179
METHOD OF ETCHING SILICON CRYSTALS

Jimmy Lee Davidson, Melbourne Beach, and Donald R. Mason, Indialantic, Fla., assignors to Radiation Incorporated, Melbourne, Fla.

Filed May 20, 1970, Ser. No. 39,092
Int. Cl. H01l 7/50
U.S. Cl. 156—8 2 Claims

ABSTRACT OF THE DISCLOSURE

A technique for making dielectrically isolated semiconductive devices on a single crystal silicon substrate, employing an etchant consisting of water, an amine and a complexing agent. The etchant acts on a silicon wafer cut from a single crystal at differing etch rates for three structural axes of the silicon crystal structure to form moats. By properly selecting moat orientation it is possible to substantially avoid undercutting of a masking oxide used to determine the geometrical pattern which is etched on the silicon wafer, and to shape the moat angles. The reduction of undercutting permits closer spacing of the pattern which is etched on the wafer, resulting in a significantly increased component density, and the angularity of the moat permits forming of smaller islands than has been feasible in the past.

BACKGROUND OF THE INVENTION

This invention relates to semiconductor devices and has particular reference to integrated circuits having a plurality of dielectrically isolated active areas or components located on a single chip.

Standard techniques of fabricating dielectrically isolated integrated circuits comprise forming a pattern of masking material on a single crystal wafer, usually silicon, and subsequently etching away the portion of the wafer not protected by the pattern, to create a plurality of islands surrounded by moats. After the etching process is completed, the wafer on its etched side is covered with a dielectric isolating material which extends into and covers all surfaces of the moats. Ordinarily, when such devices are formed, the masked silicon wafer is subjected to preheating, as by boiling water, to elevate its temperature to 115° C. or above. It is then subjected to an etchant which is maintained at approximately this same temperature. The etchant, for example, may be a concentrated solution of 25% sodium hydroxide in water. The preheated wafer is subjected to the etchant for a time sufficient to etch through the silicon wafer to a desired depth. In another well known etching process the masked wafer is subjected to hydrogen chloride (HCl) vapor to remove silicon as desired. These techniques require etching of the wafer at elevated temperatures, which is undesirable.

Although the above described methods of forming microcircuit wafers are well known and frequently used, they suffer many inherent disadvantages. The primary disadvantage stems from the fact that the etchant solution etches the silicon wafer symmetrically. As a consequence, the etchant reacts upon the wafer not only vertically into the surface of the wafer, as is desired, but also horizontally along the sides thereof; which is undesirable. This results in an undercutting of the masking agent and, because the coating is undercut by the etchant, the etched region is larger than the aperture in the masking material. It is thus necessary to allow for the undercutting by spacing the openings in the mask by an adequate distance. The requirement for greater mask opening and spacing dimensions severely limits the number of units which can be placed on a single wafer.

SUMMARY OF THE INVENTION

The instant invention overcomes these disadvantages by utilizing an etching solution which acts at differing rates along the various axes of the silicon component to be etched, and particularly which etches rapidly into the wafer, but does not undercut. By properly orienting the wafers with respect to the crystallographic axes of the silicon, etching perpendicular to the surface of the wafer can be made substantially more rapid than that which occurs along axes parallel to the surface.

Prior art techniques of etching moats also suffer a disadvantage in that they require high temperature etching. This causes the formation of pinholes in the coating, thereby resulting in an irregularly etched surface as well as undesired holes in the finished product. The required elevated temperature of the hydrogen chloride vapor etch process undesirably produces irregular islands in the finished product for this reason. It is therefore an object of this invention to provide a technique for etching wafers made from a crystallographic substance which allows closer island-to-island spacing than has heretofore been feasible, thereby increasing the density of the components permissible upon a single wafer.

It is another object of this invention to provide such a technique which permits island-to-island spacing equal to the width of the aperture left in the masking material.

It is another object of this invention to provide such a technique which permits attainment of precise moat geometry, particularly in respect to depth, width and angle of the moats.

It is another object of this invention to provide an etching technique which does not require elevated temperatures for the etching process and thereby eliminates the oxide pinhole problem and other defects associated with elevated temperature processes.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawings, wherein:

FIG. 4 is a graph of the etch rate of silicon wafer material as a function of water content of an etchant, while the complexing agent content of the etchant is maintained constant;

FIG. 5 is a graph of the etch rate of silicon as a function of the complexing agent content with the water and amine ratio held constant;

DESCRIPTION OF THE PREFERRED EMBODIMENTS

Figure 1:
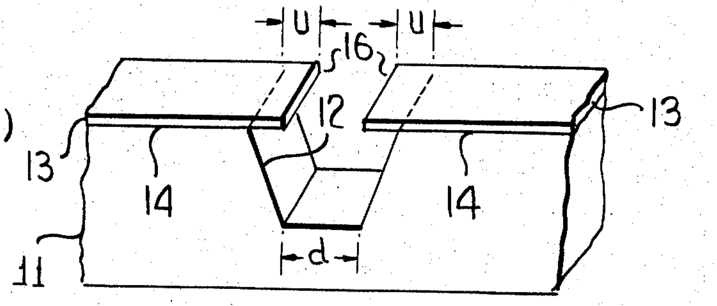
FIG.1 (PRIOR ART)
FIG. 1 is a view in perspective of a portion of a wafer etched by prior art techniques.

FIG. 1 illustrates a wafer 11 into which has been etched a moat 12 by prior art techniques. A masking layer 13 is applied to the silicon wafer 11 prior to its subjection to the etching solution. The masking layer 13 is provided with an aperture or window 16. When the etching solution is applied to the masked wafer the solution reacts upon the silicon wafer 11 through the aperture 16 and etches the moat 12 into the silicon wafer. Because the etching rate of the etching solution is rapid in all directions of the silicon wafer, the silicon is etched both downwardly into the wafer and sidewardly along the wafer resulting in an undercutting of the masking material. The undercut area is indicated in FIG. 1 by U. The width of the moat is then determined not by the dimension of aperture 16 alone but by two times the undercutting (U) plus the width of the aperture 16. This results in a substantial reduction in the number of islands 14 which can be formed upon a single wafer. The significance of the undercutting (U) relates to the fact that the invention deals with microminiature circuitry; the width of aperture 16 is therefore extremely small. There is a practical lower limit of the size of aperture 16, determined primarily by the accuracy with which the masking layer 13 can be applied to the wafer 11. When the minimum dimensions possible are allowed for an opening 16, the undercutting (U) may be a large fraction of the final opening. For example, in using prior art techniques the undercutting is of the order of 20% of the aperture 16 dimension. The symmetrically rapid etching rate of the etching solution upon the silicon wafer also results in a flat bottom dimension *d* for the moat 12.

Figure 3:
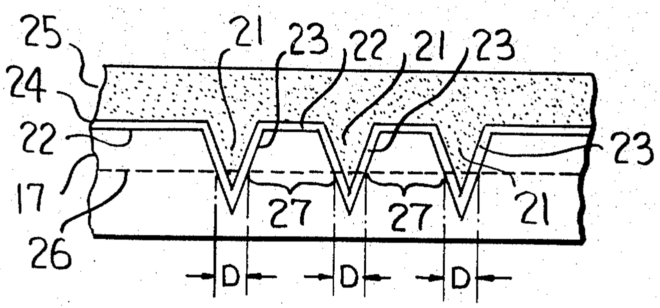
FIG. 3 is a view in transverse cross section of a product of the present invention as it appears after moats are insulated and substrated.

After moats are formed, an insulating layer 24 is applied and a substrate 25 fills the moats and covers the spaces therebetween. The etched wafer is then sliced such that the moats 12 are exposed near the bottoms of the moats. This is illustrated in FIG. 3 where dotted line 26 indicates the plane of the ultimately polished surface. For such a usage the number of components on a single wafer can be increased by decreasing the dimension *d*. A technique which substantially reduces the undercutting U and lowers dimension *d* increases the number of moats, and therefore necessarily the number of islands 14, possible on a wafer 11 of a given size. The present inventive technique realizes both of these important size reductions.

Figure 2:
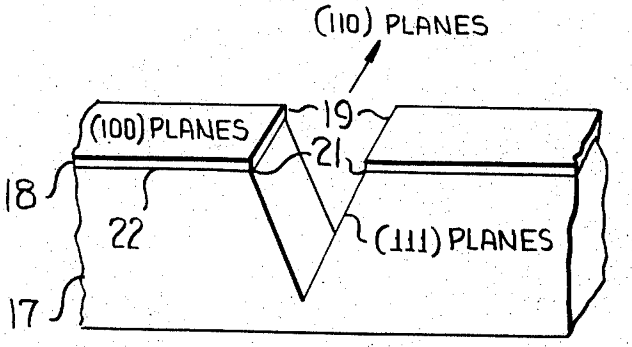
FIG. 2 is a view in perspective of a single etched moat, as made by the technique of the present invention.

FIG. 2 illustrates a silicon wafer 17 which has been etched in accordance with the technique of the present invention. A masking oxide 18 is applied to the silicon wafer prior to its subjection to the etching solution. Masking oxide layer 18 is formed in a geometric pattern which ultimately determines the geometric pattern of the etched wafer. A typical aperture 19 is provided in the masking surface to expose a portion of the silicon wafer 17 to the etching solution. The moat 21 which is formed according to the invention in the silicon wafer 17 is V-shaped. The etching rate downwardly into the wafer is substantially greater than that which occurs parallel to the surface of the wafer, resulting in a practical elimination of the undercutting of the masking coating 18. Accordingly, the upper dimension of the moat 21 is equal to the dimension of the aperture 19 formed in the masking coat 18. The forming of moat 21 results in the formation of islands 22 extending along the surface of the wafer 17.

Because the minimum feasible dimension of aperture 16 of FIG. 1 or 19 of FIG. 2 is limited by available techniques of applying the masking layer art work to the silicon wafer, the width of the aperture 12 or 21 is also limited. The minimum width of the aperture in the masking layer 13 or 18 is the same irrespective of the etching solution used in the etching process. The upper dimension of the moat is therefore determined by the size of the aperture placed in the masking layer. Because the method used to form the moat shown in FIG. 1 undercuts the masking layer, the dimensions of the finished moat 12 are greater than the aperture dimension of the masking layer. Consequently, the density of components on the wafer is decreased. This difficulty is eliminated in the wafer of FIG. 2 in that the upper dimension of moat 21 is determined solely by the aperture 19 placed in masking layer 18. As a result, the density and dimensions of the islands 22 formed by the etching process are greatly increased.

The improved structure shown in FIG. 2 is obtained using a process according to the invention which involves, first, the selection of the etchant, and second, the orientation of the silicon wafer 17 with respect to its crystallographic surfaces.

An etchant solution used in the inventive technique is comprised of water, an amine and a complexing agent. An example of a particular solution is given in Table I.

TABLE I

| Component | Abbreviation | Formula | Mole percent |
|---|---|---|---|
| Water | | $H_2O$ | 61.2 |
| Ethylenediamine | En | $NH_2(CH_2)_2NH_2$ | 35.1 |
| Pyrocatechol | Pyro | $C_6H_4(OH)_2$ | 3.7 |

It should be noted that the exact proportions shown in Table I are exemplary only. This is verified by reference to FIG. 4, which shows the variation of the etch rate of silicon in $\mu$/hr. as a function of water content of the etchant with the pyrocatechol content held constant. The graph in FIG. 4 shows a maximum etch rate when the mole fraction of water is approximately 0.65. The graph also shows that the etch rate is dependent upon the presence of water in the etching solution and therefore that water is an active element in the solution. This is verified by the graph because it shows a zero etch rate for a zero water content and a zero etch rate when the mole fraction of water is equal to one. When the mole fraction of water is one, that of *n* is zero and therefore these two substances are active components of the etchant.

FIG. 5 shows a graph of etch rate in microns per hour versus the pyrocatechol content of the etching solution. When the pyrocatechol content is reduced to zero, the etch rate is reduced. However, it is a finite number. It is also clear that the etch rate levels off and becomes substantially constant above a certain pyrocatechol content.

Accordingly, the optimum etching solution will contain a percentage of water as suggested by the graph of FIG. 4 and a percentage of a complexing agent as suggested by the graph of FIG. 5, the remainder of the solution being made up of the amine.

An article entitled "A Water-Amine-Complexing Agent System for Etching Silicon" by R. M. Finne and D. L. Klein appearing in the September 1967 issue of Journal of Electrochemical Society suggests using the etchant employed by applicants for shaping silicon into unique shapes. The article explains the reaction of various etchants upon silicon and silica and further shows that the etch rate varies as a function of crystallographic planes, where these exist. The etch rate on (100) oriented silicon was found to be approximately 50 microns per hour. The etch rate of (110) silicon oriented was found to be approximately 30 microns per hour and that of (111) oriented silicon approximately 3 microns per hour. The article teaches how this information can be used to form silicon discs into unique configurations. The result of the process is exemplified by the ramp-sided mesa shown in FIG. 11 of the article.

Because the etch rate differs substantially, and controllably, along the three planes of the silicon wafer, a high degree of control over the etch rate is possible. By orienting the (100) plane of the silicon disc along the plane of the wafer, as shown in FIG. 2, the etch rate is substantially higher perpendicular to the plane of the wafer than it is in the other directions. For this reason, by applying the art work formed by the masking oxide along the (100) surface such that the moats to be etched into the wafer are parallel to the (110) planes the undercutting is eliminated. The aperture of the etched moat is therefore substantially equal to the aperture formed by the art work. The resulting configuration of the etched moat is a V-shaped moat. The opening aperture of the moat and the depth of the moat are readily controllable by controlling the aperture 19 which is placed into the masking art work. By following the principle of allowing the surface of the silicon wafer to be sliced along the (100) surface, and the moats to be parallel with the (110)

planes the sides of the V-shaped moat are the (111) planes of the silicon disc, and the moat angle is precisely determined.

After the etching process is completed, a thin dielectric oxide layer 24 is applied to the silicon wafer 17, including the moats. After the application of the dielectric layer to the etched wafer, a thick poly-crystal layer 25 is applied to the oxide layer in sufficient thickness to fill the moats and form a total substrate for the wafer. By then slicing the silicon disc 17 through moats 21 along the broken line 26, a plurality of islands 27 having dimensions D are formed. The addition of the dielectric layer 24 and the poly-crystal layer 25 suggests that an integrated circuit can be formed in this manner. When this is done the network which forms the masking oxide layer 18 is designed so that the etched silicon wafer 17 has a desired configuration. Poly-crystal layer 25 then forms the substrate of the integrated circuit and the islands 27 form the components of the circuit.

The advantages of the elimination of undercutting can now be fully appreciated. Because no undercutting takes place, moats 21 can be made narrower than was possible with prior art techniques; therefore islands 27 can be placed closer together. In addition, apertures 19 can be placed closer together in the masking step, permitting smaller islands 27 to be formed than is possible with prior art techniques. Particularly, when the wafer is sliced along line 26 an increased number of islands 27 can be formed in a given surface area because for a particular thickness of wafer, the dimension D can be made much smaller than dimension *d* of the prior art method.

In performing the etching the masked wafer is submerged in the etchant for a time sufficient to accomplish the desired etching. The wafer therefore must assume the same temperature as the etchant. As mentioned hereinabove, in many existing techniques temperatures several magnitudes above that of boiling water are required. This is detrimental to the masking material and can result in inferior finished products. The etchant of the invention is preferably maintained at a temperature between 100° C. and 130° C. These temperatures are far below the lowest which will harm either the wafer or the masking compound.

Figure 6:
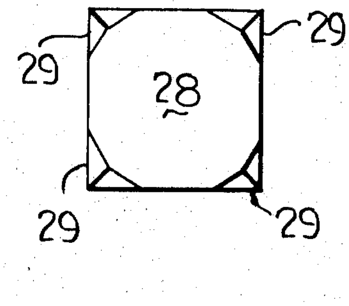
FIG. 6 is a top view of an island formed without corner compensation.

FIG. 6 is a top view of an island 28 formed without corner compensation. The art work used to mask an island without compensation contains square apertures. However, because some etching occurs at the corners of the island the latter is slightly faceted as indicated by reference number 29.

Figure 7:
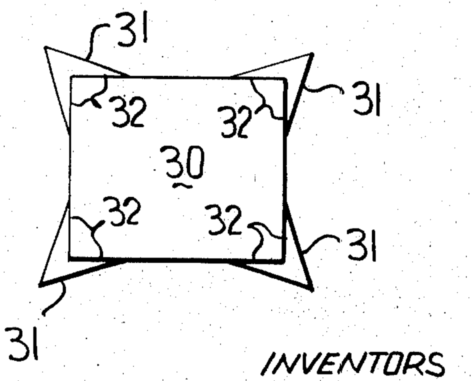
FIG. 7 is a top view of an island formed with corner compensation.

FIG. 7 shows a top view of an island 30 formed using corner compensation. The compensation consists of forming an angular extension 31 into the masking layer diametrically extending from each corner of the island 30. Consequently the etching which takes place at the corners merely removes the corner extensions 31 instead of the corners themselves. As a result the compensated island has substantially square corners 32.

The preferable dimensions of the extensions can readily be determined experimentally within the purview of those skilled in the art.

While we have described and illustrated specific embodiments of our invention, it will be clear that variations of the details of construction which are specifically illustrated and described may be resorted to without departing from the true spirit and scope of the invention as defined in the appended claims.

We claim:

1. In a process for fabricating dielectrically isolated integrated circuits from a single crystal silicon body having two major planar surfaces, the steps of forming said single crystal silicon body with said major planar surfaces oriented parallel to the (100) crystallographic plane thereof, selectively etching said single crystal silicon body from one of said major planar surfaces to form moats therein by using an etch solution composed of water, ethylenediamine, and pyrocatechol, which preferentially attacks the single crystal silicon in the selected areas at a rapid rate in a direction perpendicular to said (100) plane and at a relatively slower rate in directions transverse to said perpendicular direction, the areas to be etched being selectively defined by masking the remainder of said one major planar surface against attack by said etch solution, such that at least some of said moats are oriented parallel to the (110) crystallographic axis of the single crystal silicon body, with side surfaces of said some moats coinciding with the (111) crystallographic planes of the single crystal silicon body, said masking step including compensating for etching at intersections of said channels by extending the masking into the areas selected for the moats at each corner of an intersection of the moats, to produce substantially square corners thereat.

2. A method of dividing a portion of a single crystal wafer into attached segments of desired shape partially separated from each other by moats, comprising cutting said wafer to provide it with major planar faces substantially perpendicular to the (100) crystallographic axis along which said moats are to penetrate the wafer, masking one of said planar faces with an etch-resistant layer while leaving unmasked the desired surface locations of said moats along said one face, subjecting said wafer at said one face to an etchant composed of water, an amine, and a complexing agent for preferential etching of the silicon along the (100) axis, with negligible undercutting of the silicon at said one face along the edges of the mask parallel to the (110) axis, to produce moats having considerably greater depth than width, with the width of each moat conforming substantially to the width of the respective unmasked surface area on said one face, said moats surrounding the wafer segments, and each segment having a portion of the original surface of the wafer as its surface, said masking including configuring the mask to substantially eliminate faceting at the corners of the segments during the etching step, by providing angular extensions of the mask at the corners of the segments, said etchant consisting of the named components in the approximate ratio of 61 mole percent water to 35 mole percent ethylenediamine to 4 mole percent pyrocatechol.

References Cited

UNITED STATES PATENTS

| | | | |
|---|---|---|---|
| 3,623,218 | 11/1971 | Mitarai et al. | 156—17 X |
| 3,486,892 | 12/1969 | Rosvold | 96—36.2 |
| 3,458,369 | 7/1969 | Marinace | 29—582 X |
| 3,171,762 | 3/1965 | Rutz | 117—212 X |
| 2,858,730 | 11/1958 | Hanson | 156—17 X |
| 3,160,539 | 12/1964 | Hall et al. | 156—17 |
| 3,385,729 | 5/1968 | Larchian | 117—200 |
| 3,493,820 | 2/1970 | Rosvold | 156—17 X |
| 3,544,401 | 12/1970 | Jarman | 156—17 |
| 3,559,283 | 2/1971 | Kravitz | 29—583 X |

OTHER REFERENCES

The Electrochemical Society, Inc. Extended Abstracts of Electronics Division, Luminescence Optical Masers Semiconductors, vol. 13, No. 1, May 3–7, 1964, Abstract No. 82, Water-Amine-Complexing Agent System for Etching Silicon by Finne et al., pp. 203 and 204.

WILLIAM A. POWELL, Primary Examiner

U.S. Cl. X.R.

156—17